United States Patent
Goncalves et al.

(10) Patent No.: US 7,449,933 B2
(45) Date of Patent: Nov. 11, 2008

(54) VOLTAGE LEVEL TRANSLATOR

(75) Inventors: Christophe Goncalves, Grenoble (FR); Bruno Salvador, Crolles (FR); Olivier Goducheau, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 64 days.

(21) Appl. No.: 11/313,281

(22) Filed: Dec. 20, 2005

(65) Prior Publication Data

US 2007/0139092 A1    Jun. 21, 2007

(51) Int. Cl.
*H03L 5/00* (2006.01)
(52) U.S. Cl. ....................................................... 327/333
(58) Field of Classification Search ................. 327/333; 326/63, 68, 80–83
See application file for complete search history.

(56) References Cited

U.S. PATENT DOCUMENTS

| 6,617,896 B2 * | 9/2003 | Uenishi et al. ............... 327/170 |
| 6,864,718 B2 * | 3/2005 | Yu ................................. 326/68 |
| 7,106,123 B2 * | 9/2006 | Kanno et al. ................. 327/333 |
| 7,200,053 B2 * | 4/2007 | Kim et al. ............... 365/189.11 |
| 2005/0285658 A1 * | 12/2005 | Schulmeyer et al. ......... 327/333 |
| 2006/0077166 A1 * | 4/2006 | Kwon ........................... 345/98 |

* cited by examiner

*Primary Examiner*—Quan Tra
(74) *Attorney, Agent, or Firm*—Gardere Wynne Sewell LLP

(57) ABSTRACT

A low to high voltage level converter includes first and second n-channel transistors arranged to force to the ground voltage a first connection node and a second connection node, respectively. A boosting circuit operates to boost an input voltage of at least one of a first and second control nodes for the first and second n-channel transistors above a low voltage level. The converter further includes first and second cross-coupled p-channel transistors arranged to force to the high voltage level the first connection node and the second connection node, respectively. A digital output signal is taken from one of the first and second connection nodes.

16 Claims, 4 Drawing Sheets

VOLTAGE LEVEL TRANSLATOR

BACKGROUND OF THE INVENTION

1. Technical Field of the Invention

The present invention relates to low to high voltage level translators. A low to high voltage level translator allows for the conversion of a digital input signal between ground and a low voltage, for example, 1.2 V, to a digital input signal between ground and a high voltage, for example, 3.3 V.

There are many known applications of voltage level translators. Voltage level translators may, for example, be used in memories, in input/output circuits (I/O circuits), or in analog circuits, (power management circuits, charge pumps, and the like). A voltage level translator may be used in any circuit operating with a dual voltage.

2. Description of Related Art

FIG. 1 illustrates an example of low to high voltage level translator according to the Prior Art.

The low to high level translator 10 comprises a first stage 1 and a second stage 2, connected in series between a ground voltage and a high power supply voltage VDDH.

The second stage 2 is connected to ground. The second stage 2 comprises a first nMOS transistor 4 and a second nMOS transistor 3, arranged to force to the ground voltage a first connection node 9 and a second connection node 8, respectively.

A digital output signal OUT is read at the first connection node 9. The second stage 2 is arranged to force the digital output signal OUT to the ground voltage.

The first nMOS transistor 4 is driven by a voltage at a first control node 14 and the second nMOS transistor 3 is driven by a voltage at a second control node 13. The voltages at said first and second control nodes are controlled by complementary control signals Vc1, Vc2 derived from a digital input signal IN to be translated.

The first stage 1 is arranged to force the digital output signal OUT to a high power supply voltage VDDH. The first stage 1 is connected to the high power supply voltage VDDH. The first stage 1 comprises a first pMOS transistor 6 and a second pMOS transistor 5, respectively arranged to force to the high power supply voltage VDDH the first connection node 9 and the second connection node 8. The first pMOS transistor 6 is driven by the voltage at the second connection node 8 and the second pMOS transistor 5 is driven by the voltage at the first connection node 9.

An inverter 7 may allow to provide the second control signal Vc2 from the digital input signal IN. The first control signal Vc1 may equal the digital input signal IN.

When the digital input signal IN has a value corresponding to a '0', i.e. the voltage of the digital input signal IN substantially equals the ground voltage, the first NMOS transistor 4 is driven by a value corresponding to a '1'. The first nMOS transistor 4 is subsequently on, thus forcing the digital output signal OUT to the ground voltage.

The second pMOS transistor 5 driven by the voltage of the digital output signal OUT is hence on, thus forcing the second connection node 8 to the high power supply voltage VDDH.

The first pMOS transistor 6 driven by the voltage at the second connection node 8 is hence off, thus avoiding a current between the high power supply voltage VDDH and the digital output signal OUT. Furthermore, the voltage difference between the source terminal of the second NMOS transistor 3 and its gate terminal equals substantially zero. The second nMOS transistor 3 is hence blocked, thus avoiding a current between the second connection node 8 and the ground.

When the digital input signal IN has a value corresponding to a '1', i.e. the voltage of the digital input signal IN substantially equals the low power supply voltage, the second nMOS transistor 3 is on, thus forcing the second connection node 8 to the ground voltage. The first pMOS transistor 6 driven by the second connection node 8 is subsequently on, thus forcing the digital output signal OUT to the high power supply voltage VDDH.

The second pMOS transistor 5 driven by the voltage of the digital output signal OUT is hence off, thus avoiding a current between the high power supply voltage VDDH and the second connection node 8.

Furthermore, as the digital input signal IN has a value corresponding to a '1', the second control signal Vc2 has a value corresponding to a '0'. The first NMOS transistor is hence blocked, thus avoiding a current between the first connection node 9 and the ground.

The transistors 3, 4, 5, 6 have to support voltages between ground and the high power supply voltage at their source terminals and drain terminals. Therefore, the transistors 3, 4, 5, 6 are designed for use with relatively high voltages. The transistors 3, 4, 5, 6 may be, for example, double oxide CMOS transistors.

Double oxide CMOS transistors are designed to operate within a voltage range varying from the ground voltage to the high power supply voltage.

However, the first nMOS transistor 3 and the second nMOS transistor 4, although being double oxide transistors, are driven by relatively low voltages, i.e. a signal varying between the ground voltage to the low power supply voltage.

Advances in semiconductor fabrication and manufacturing lead to decreasingly low power supply voltage values, e.g. 1V or even less than 1V.

When driven by a power supply voltage having such a relatively low value, e.g. 0.9V, a double oxide transistor designed to be driven by a relatively high power supply voltage, e.g. 3.3 V, may exhibit relatively poor performances. Typically, relatively long transition times may prevent the double oxide transistor to operate properly with relatively high frequencies.

There is accordingly a need to provide a voltage level translator with better performance, even when driven by a digital input signal taking on relatively low values.

SUMMARY OF THE INVENTION

In a first aspect, the present invention provides a voltage level translator to convert a digital input signal lying between a ground voltage and a low voltage level to a digital output signal lying between the ground voltage and a high voltage level. A first n-channel transistor and a second n-channel transistor are respectively arranged to force to the ground voltage a first connection node and a second connection node. The first n-channel transistor is driven by a voltage at a first control node, and the second n-channel transistor is driven by a voltage at a second control node. The voltages at said first and second control nodes are respectively controlled by complementary control signals provided by the digital input signal. A first p-channel transistor and a second p-channel transistor are respectively arranged to force to the high voltage level the first connection node and the second connection node. The first n-channel transistor is driven by a voltage at the second connection node, and the second n-channel transistor is driven by a voltage at said first connection node. The digital output signal is read at the first connection node. The voltage level translator further comprises boosting means adapted to boost the voltage of at least one control node beyond the low voltage level.

The first n-channel transistor is connected to the first p-channel transistor via the first connection node and the second n-channel transistor is connected to the second p-channel transistor via the second connection node. Therefore, said n-channel transistors have to support voltages between the ground voltage and the high voltage level, between their source terminals and drain terminals. Said n-channel transistors are designed to operate within a relatively large range of voltages, e.g. from 0 V to 3.3 V.

The boosting of the voltage of at least one control node allows increasing the value of said voltage beyond the low voltage level, and thus improving the operating of the corresponding at least one n-channel transistor. Otherwise said, the boosting allows improving the driving of said n-channel transistor.

The boosting means are preferably adapted to boost the voltages of the first control node and the second control node.

Alternatively, the boosting means are adapted to boost the voltage of a single control node, e.g. the first control node.

The boosting means preferably comprise at least one capacitive circuit connected to a corresponding control node to be boosted. The capacitive circuit allows transforming a positive edge into a boosted voltage. The capacitive circuit hence allows helping a transistor corresponding to the boosted control node to force to ground the corresponding connection node.

The voltage of the control node is subsequently boosted at each positive edge of the corresponding control signal.

A first control signal may for example comprise a complement of the digital input signal. The digital input signal varies between ground and a low voltage, e.g. 0.75 V. A capacitive circuit connected to the control node controlled by the first control signal allows providing a boosted voltage at each negative edge of the digital input signal. The boosted voltage may for example reach 1.3 V or 1.5 V, thus allowing an acceptable driving of the corresponding transistor.

A second control signal may for example correspond to the digital input signal. A capacitive circuit connected to the control node controlled by such the second control signal allows providing a boosted voltage at each positive edge of the digital input signal.

The capacitive circuit may for example comprise a capacitor, or a transistor arranged as a capacitor.

Alternatively, the voltage level translator may comprise any other kind of boosting means allowing to boost the voltage of said at least one control node.

The voltage level transistor preferably comprises, for at least one control node to be boosted, first preloading means to bring back the boosted voltage of said control node down to the low voltage level. The bringing back may be performed once the corresponding connection node has been forced to ground. The control node is preloaded to the low voltage level before a further transition occurs, thus avoiding the voltage of the control node to regularly increase as the digital input signal rises again to the low voltage level.

Alternatively, the voltage level translator may not comprise said first preloading means.

The voltage level transistor preferably comprises, for at least one control node to be boosted, second preloading means to bring back the voltage of said control node up to the low voltage level. The boosting is only transitory. The control node is preloaded to the low voltage level, thus allowing to avoid the corresponding connection node being in an indefinite state.

Alternatively, the voltage level transistor may not comprise said second preloading means.

The voltage level transistor preferably comprises processing means to provide complementary control signals from the digital input signal.

The processing means typically comprise a inverter, or any other inverting means allowing to provide complementary control signals from the digital output signal.

The processing means may further comprise additional inverters, so as to provide clean and strong control signals.

The processing means may support only low voltages, for example voltages between 0 V and 1.2 V. Processing means may subsequently comprise transistors designed to operate with relatively low voltages. Such transistors, e.g. simple oxide CMOS transistors, are relatively compact, unlike voltage resistant transistors such as double oxide transistors.

In a second aspect, the present invention provides a memory device comprising a plurality of voltage level translators according to the first aspect of the invention.

The memory device may for example comprise a dynamic random access memory (DRAM).

A 128 kilo-bits memory according to an aspect of the invention may comprise 33 voltage level translators according to the first aspect of the invention.

A 4 mega-bits memory according to an aspect of the invention may comprise 1056 voltage level translators according to the first aspect of the invention.

The voltage level translator according to an aspect of the invention may be used within other devices, e.g. I/O circuits, or more generally, in analog circuits (power management circuits etc.).

In a third aspect, the present invention provides a method for converting a digital input signal lying between a ground voltage and a low voltage level to a digital output signal lying between the ground voltage and a high voltage level, said method comprising forcing a first connection node and a second connection node to the ground voltage using a first n-channel transistor and a second n-channel transistor respectively, said first n-channel transistor being driven by a voltage at a first control node, and said second n-channel transistor being driven by a voltage at a second control node, the voltages at said first and second control nodes being respectively controlled by complementary control signals derived from the digital input signal, forcing to the high voltage level the first connection node and the second connection node using a first p-channel transistor and a second p-channel transistor respectively, said first n-channel transistor being driven by a voltage at the second connection node, said second n-channel transistor being driven by a voltage at the first connection node, the digital output signal being read at one of the first and second connection nodes, and boosting the voltage of at least one of the first and second control nodes beyond the low voltage level.

In accordance with an embodiment of the invention, a voltage level translator comprises a level shifting circuit having a pair of complementary inputs and further having an output at high voltage logic levels, and a capacitive voltage boosting circuit which receives complementary input signals at low voltage logic levels and generates complementary signals at mid-voltage logic levels for application to the pair of complementary inputs of the level shifting circuit.

In accordance with another embodiment, a level shifting circuit comprises a pair of cross-coupled p-channel transistors source/drain coupled between a high voltage reference and corresponding first and second connection nodes. A first n-channel transistor is drain coupled to the first connection node, and a second n-channel transistor is drain coupled to the second connection node. A first capacitor is coupled between a gate of the first n-channel transistor and a first input at low voltage logic levels, and a second capacitor is coupled between a gate of the second n-channel transistor and a second, complementary, input at low voltage logic levels.

BRIEF DESCRIPTION OF THE DRAWINGS

Other characteristics and advantages of the invention will become further apparent on reading the description which follows. The latter is purely illustrative and should be read in conjunction with the appended drawings, in which.

DETAILED DESCRIPTION OF THE DRAWINGS

In all the figures, the same references denote similar or substantially similar elements.

Figure 1:
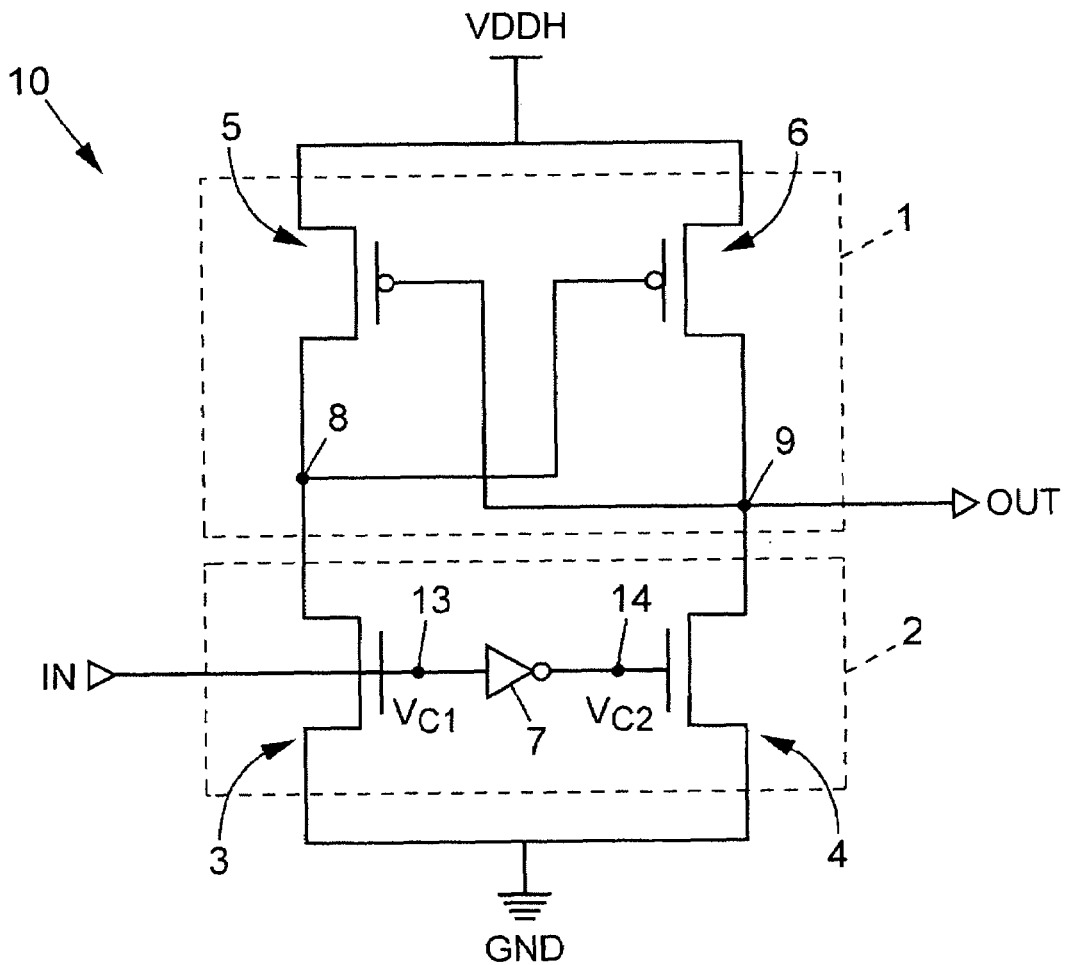
FIG. 1 shows an example of low to high voltage level translator according to Prior Art.
Figure 2:
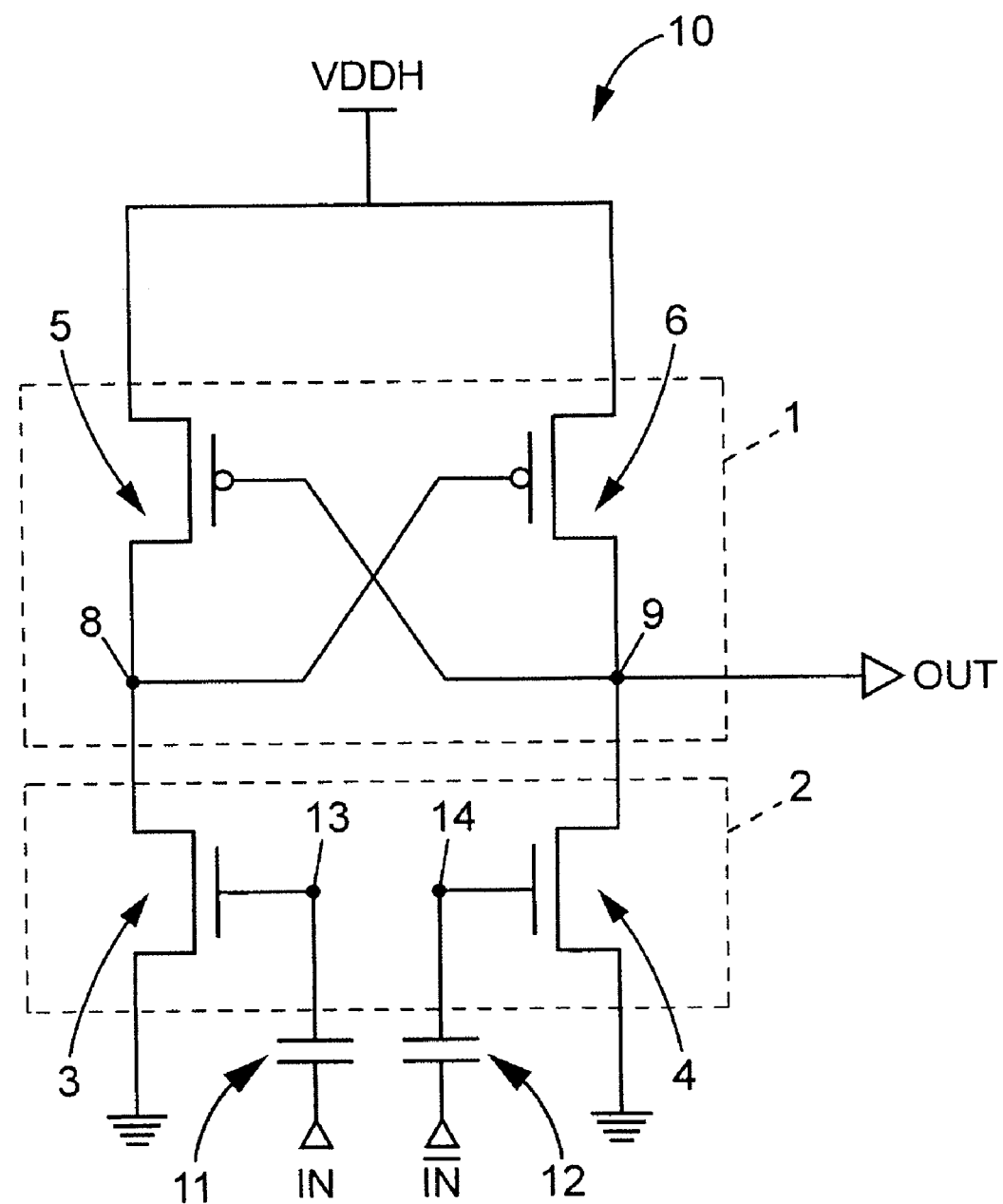
FIG. 2 shows an example of low to high voltage level translator according to a first embodiment of the present invention.

FIG. 2 shows an example of a low to high voltage level translator according to a first embodiment of the present invention. The voltage level translator 10 allows to convert a digital input signal IN between ground and a low voltage level LVDD (i.e., at low voltage logic levels) to a digital output signal OUT between ground and a high voltage level HVDD (i.e., at high voltage logic levels).

In this example, the high voltage level HVDD and the low voltage level LVDD respectively comprise a high power supply voltage and a low power supply voltage.

The voltage level translator 10 comprises a first stage 1 and a second stage 2.

The second stage 2 comprises nMOS transistors 3 and 4.

The second stage 2 comprises a first NMOS transistor 4 to force to ground a first connection node 9 at which the digital output signal OUT may be read. The first nMOS transistor 4 is driven by the voltage at a first control node 14. The voltage at said first control node is controlled by a first control signal corresponding for instance to a complement of the digital input signal.

The first nMOS transistor 4 allows to connect a first connection node 9 to ground when on.

The second stage 2 comprises a second nMOS transistor 3 to force to ground a second connection node 8. The second nMOS transistor 3 is driven by a voltage at a second control node 13. The voltage at said second control node 13 is controlled by a second control signal that may correspond to the digital input signal.

The second transistor 3 allows to connect a second connection node 8 to ground when on.

The first stage 1 is connected to a high voltage source. The first stage 1 comprises pMOS transistors 5 and 6 connected in a cross-coupled configuration.

A first pMOS transistor 6 is arranged to force the first connection node 9 to the high voltage level when on. The first pMOS transistor 6 is driven by the voltage at the second connection node 8.

A second pMOS transistor 5 is arranged to force the second connection node 8 to the high voltage level when on. Said second pMOS transistor 5 is driven by the voltage at the first connection node 9.

The second stage 2 is arranged such that each control node 13, 14 has a boosted voltage when the corresponding transistor 3, 4 forces the corresponding connection node 8, 9 to ground. Boosting means 11, 12 allow to boost the voltages of the control nodes 13, 14. The boosting means may comprise a first capacitor 12 and a second capacitor 11.

When the second control signal has a zero value, i.e. the voltage of the digital input signal falls to substantially the ground voltage, the first control signal rises to substantially the low voltage level LVDD. The first capacitor 12, being sensitive to transitions of the first control signal, allows to transform a positive edge of the first control signal into a boosted voltage at the first control node 14 (i.e., to mid-voltage logic levels where logic high has a voltage between LVDD and HVDD; see, also, as discussed below, FIG. 4).

The voltage at the first control node 14 subsequently rises beyond the low voltage level. The voltage at the first control node 14 may for example rise up to 1.4 V for a low voltage level of 0.9 V.

The first nMOS transistor 4 driven by said boosted voltage is therefore properly turned on, thus properly resetting the value of the digital output signal OUT.

When the second control signal is set to '1', i.e. the voltage of the digital input signal rises to substantially the low voltage level LVDD, the second capacitor 11 allows to provide a boosted voltage (again, mid-voltage logic levels) at the second control node 13 driving the second nMOS transistor 3.

The second nMOS transistor 3 driven by said boosted voltage is therefore properly turned on, thus properly resetting the voltage value at the second connection node 8.

The first pMOS transistor 6, being driven by the voltage at the second connection node 8, is subsequently turned on and forces the value of the digital output signal OUT to the high voltage level HVDD.

Figure 3:
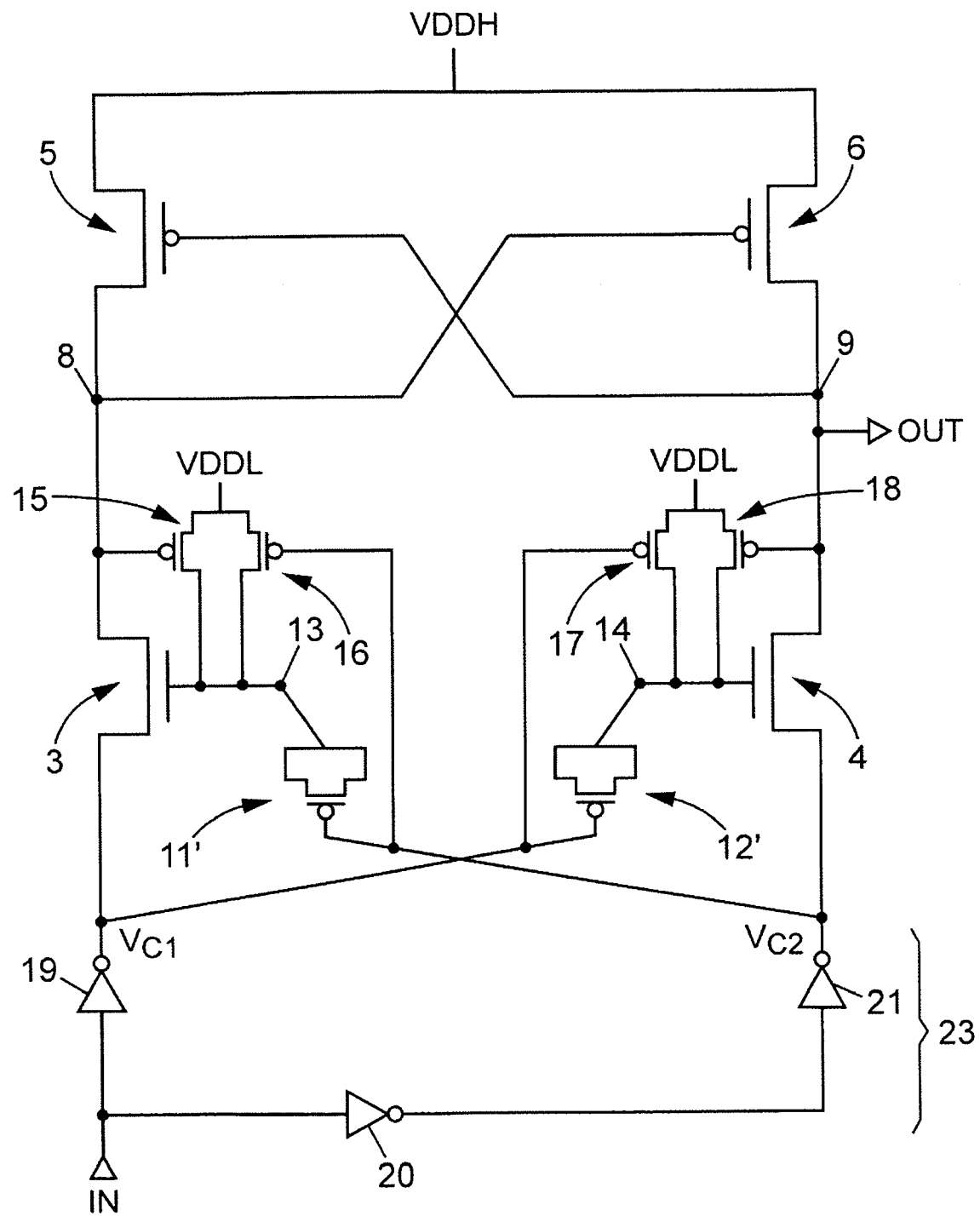
FIG. 3 shows an example of low to high voltage level translator according to a second embodiment of the present invention.
Figure 4:
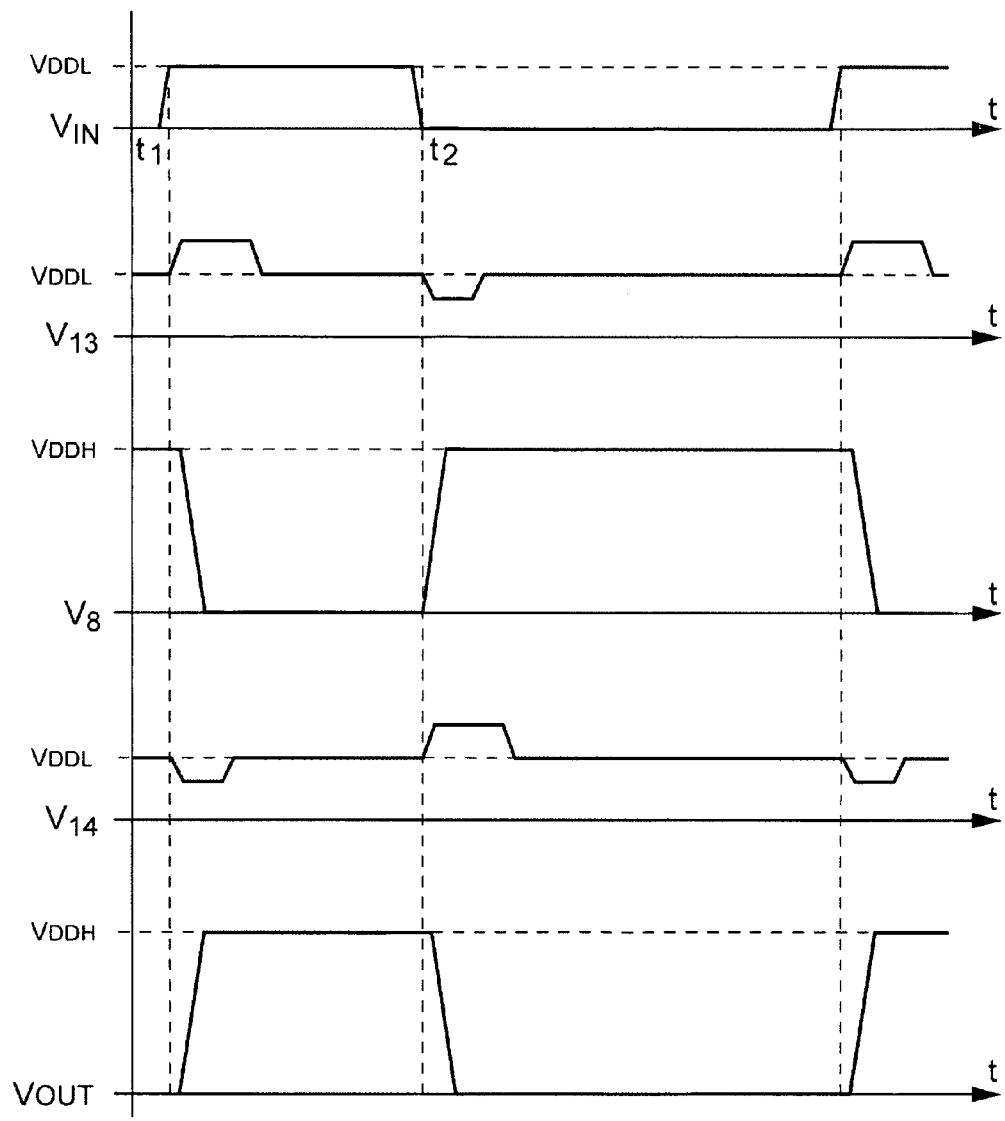
FIG. 4 shows an example of time chart illustrating an operating of the low to high voltage level translator shown in FIG. 3.

FIGS. 3 and 4 both relate to a low to high voltage level translator according to a second embodiment of the present invention. FIGS. 3 and 4 are subsequently discussed simultaneously.

In this example, the high voltage level HVDD and the low voltage level LVDD respectively comprise a high power supply voltage and a low power supply voltage.

Processing means 23 allows providing clean and strong control signals Vc1, Vc2 from a digital input signal IN. The input stage comprises three inverters 19, 20, 21 designed from relatively compact transistors (not represented). The control signals Vc1, Vc2 comprise a first control signal Vc1 and a second control signal Vc2 having complementary values.

First boosting means 12' allow connecting the first control signal Vc1 to a first control node 14 driving a first n-channel transistor 4.

Second boosting means 11' allow connecting the second control signal Vc2 to a second control node 13 driving a second n-channel transistor 3.

In the second embodiment, the first and second boosting means respectively comprise first and second capacitor arranged transistors 11', 12'.

The n-channel transistors 3, 4 are respectively connected at their drain terminals to two p-channel transistors 5, 6 via connection nodes 8, 9.

Furthermore, a first p-channel transistor 6 connected to the first n-channel transistor 4 via a first connection node 9 is driven by the voltage of a second connection node 8. A second p-channel transistor 5 connected to the second n-channel transistor 3 via the second connection node 8 is driven by the voltage of the first connection node 9.

A digital output signal OUT is read at the first connection node 9.

If, as shown in FIG. 4, the digital input signal IN rises up to a low voltage level VDDL at a first time t1, the voltage V13 of the second control node 13 is boosted beyond the low voltage level VDDL, thus allowing to improve the operating of the second n-channel transistor 3. The second n-channel transistor 3 is subsequently properly turned on, thus rapidly forcing the voltage V8 of the second connection node 8 to ground.

First preloading means 15 allow to bring back the boosted voltage V13 of said control node down to the low voltage level VDDL once the voltage V8 at the second connection node is turned to ground. In this exemplary embodiment, the first preloading means 15 comprise a p-channel transistor driven by the voltage V8 at the second connection node 8. The first preloading means 15 are slower than the second boosting means 11', thus allowing the voltage V13 at the second control node 13 to remain beyond the low voltage level for a relatively short period of time.

The voltage V8 at the second connection node 8 drives the first p-channel transistor 6. As the voltage V8 at the second connection node 8 has a value substantially equal to ground, the first p-channel transistor 6 forces the voltage VOUT of the first connection node to the high voltage level VDDH.

Meanwhile, the first control signal Vc1 falls down to ground as the digital input signal IN rises up to the low level value VDDL. The first capacitor arranged transistor 12' provides a relatively low voltage V14 at the first control node 14.

However, second preloading means 17 allow preloading the voltage V14 at the first control node 14 to the low voltage level VDDL. In this exemplary embodiment, the second preloading means 17 comprise a p-channel transistor driven by the first control signal Vc1. Said p-channel transistor is turned on by the resetting of the first control signal Vc1.

The first n-channel transistor 4 is hence driven by a voltage substantially equal to the low voltage level. However, the voltage difference between the gate terminal and the source terminal of the first n-channel transistor 4 has a zero value. The first n-channel transistor 4 is hence blocked, thus avoiding any current between the first connection node 9 and an output of inverter 21.

As a consequence, the turning off of the first n-channel transistor 4 allows avoiding a short circuit and an over consumption.

If the digital input signal IN falls down to ground at a second time t2, the first control signal Vc1 rises up to the low voltage level VDDL. The voltage V14 at the first control node 14 is subsequently boosted beyond the low voltage level VDDL, thus properly turning the first n-channel transistor 4 on. The first n-channel transistor 4 hence rapidly forces to ground the digital output signal VOUT.

Third pre-loading means 18 allow to bring the voltage V14 at the first control node 14 down to the low voltage level VDDL once the voltage at the first connection node 9 is turned to ground. The first n-channel transistor 4 subsequently remains on. The third pre-loading means 18 may comprise a transistor driven by the first connection node VOUT. The third pre-loading means 18 and the first pre-loading means 15 both allow to bring back a boosted voltage down to the low voltage level VDDL and may have similar structures.

Meanwhile, the second control signal Vc2 falls down to ground. The voltage VI 3 at the second control node 13 is hence relatively low, as shown in FIG. 4. Fourth preloading means 16 allow to bring back the voltage V13 at the second control node 13 up to the low voltage level VDDL.

The second n-channel transistor 3 is hence driven by a voltage substantially equal to the low voltage level. However, the voltage difference between the gate terminal and the source terminal of the second n-channel transistor 3 substantially equals zero. The second n-channel transistor 3 is hence turned off, thus avoiding a current between the second connection node 8 and an output of inverter 19.

As the consequence, the turning off of the second n-channel transistor 3 allows avoiding a short circuit and an over consumption.

Since the second p-channel transistor 5, driven by the voltage VOUT at the first connection node 9, is on, the voltage V8 at the second connection node 8 may reach the high voltage level VDDH. The source and drain terminal of the second n-channel transistor 3 hence have non-zero voltages. As the consequence, the turning on of the second n-channel transistor 3 on does not create any short circuit.

The fourth pre-loading means 16 and the second pre-loading means 17 have similar functions, i.e. bringing back a voltage at a control node up to the low voltage level, and may have relatively similar structures, as shown in FIG. 3.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A voltage level translator to convert a digital input signal lying between a ground voltage and a low voltage level to a digital output signal lying between the ground voltage and a high voltage level, comprising:

a first n-channel transistor and a second n-channel transistor arranged to force to the ground voltage a first connection node and a second connection node, respectively, wherein said first n-channel transistor is driven by a voltage at a first control node, and said second n-channel transistor is driven by a voltage at a second control node, the voltages at said first and second control nodes being respectively controlled by complementary control signals derived from the digital input signal;

a first p-channel transistor and a second p-channel transistor arranged to force to the high voltage level the first connection node and the second connection node, respectively, wherein said first n-channel transistor is driven by a voltage at the second connection node, said second p-channel transistor is driven by a voltage at the first connection node, and the digital output signal is read at one of the first and second connection nodes;

boosting means for boosting the voltage of at least one of the first and second control nodes beyond the low voltage level; and for at least one of the first and second control node to be boosted preloading means having a control input coupled to receive a voltage at the first connection node to bring back the boosted voltage on said control node down to the low voltage level.

2. The voltage level translator of claim 1, wherein the boosting means comprise at least one capacitive circuit, said capacitive circuit being connected to a corresponding control node to be boosted.

3. The voltage level translator of claim 1, further comprising, for at least one of the first and second control node to be boosted, preloading means to bring back the voltage on said first control node up to the low voltage level.

4. The voltage level translator of claim 1, further comprising processing means to provide complementary control signals from the digital input signal.

5. The voltage level translator of claim 1 wherein the voltage level translator is used within a memory device.

6. The voltage level translator of claim 5, wherein said processing means comprise at least one inverter.

7. The voltage level translator of claim 5, wherein said memory device comprises a dynamic random access memory.

8. A method for converting a digital input signal lying between a ground voltage and a low voltage level to a digital output signal lying between the ground voltage and a high voltage level, comprising:
  forcing a first connection node and a second connection node to the ground voltage using a first n-channel transistor and a second n-channel transistor, respectively, wherein said first n-channel transistor is driven by a voltage at a first control node, and said second n-channel transistor is driven by a voltage at a second control node, the voltages at said first and second control nodes being respectively controlled by complementary control signals derived from the digital input signal;
  forcing to the high voltage level the first connection node and the second connection node using a first p-channel transistor and a second p-channel transistor, respectively, wherein said first n-channel transistor is driven by a voltage at the second connection node, said second n-channel transistor is driven by a voltage at the first connection node, and the digital output signal is read at one of the first and second connection nodes;
  boosting the voltage of at least one of the first and second control nodes beyond the low voltage level; and
  for at least one of the first and second control node to be boosted, bringing back the boosted voltage on said control node down to the low voltage level;
  wherein bringing back the boosted voltage on said control node down to the low voltage level is controlled by, and functions in response to, a voltage at one of said first and second connection nodes.

9. The method of claim 8, further comprising, for at least one of the first and second control node to be boosted, bringing back the voltage on said control node up to the low voltage level.

10. A voltage level translator, comprising:
  a level shifting circuit having a pair of complementary inputs and further having an output at high voltage logic levels; and
  a capacitive voltage boosting circuit which receives complementary input signals at low voltage logic levels and generates complementary signals at boosted voltage logic levels for application to the pair of complementary inputs of the level shifting circuit; and
  circuitry, associated with the pair of complementary inputs of the level shifting circuit, to restore one of the complementary inputs from a boosted voltage level to a low voltage level in response to a control input coupled to a latching output of the level shifting circuit.

11. The translator of claim 10 wherein the capacitive voltage boosting circuit comprises a first capacitor circuit coupled in series between a first complementary input and a first complementary input signal at the low voltage logic levels, and a second capacitor circuit coupled in series between a second complementary input and a second complementary input signal at the low voltage logic levels.

12. The translator of claim 11 wherein the first and second capacitor circuits each comprise capacitor arranged transistors.

13. A level shifting circuit, comprising:
  a pair of cross-coupled p-channel transistors source/drain coupled between a high voltage reference and corresponding first and second connection nodes;
  a first n-channel transistor drain coupled to the first connection node;
  a second n-channel transistor drain coupled to the second connection node;
  a first capacitor coupled between a gate of the first n-channel transistor and a first input at low voltage logic levels;
  a second capacitor coupled between a gate of the second n-channel transistor and a second, complementary, input at low voltage logic levels;
  a first preloading p-channel transistor source/drain coupled between a low voltage reference and the gate of the first n-channel transistor, wherein a gate of the first preloading p-channel transistor is coupled to the first connection node; and
  a second preloading p-channel transistor source/drain coupled between the low voltage reference and the gate of the second n-channel transistor, wherein a gate of the second p-channel transistor is coupled to the second connection node.

14. The circuit of claim 13 wherein the first and second capacitors each comprise capacitor arranged transistors.

15. The circuit of claim 13 wherein the first input is coupled to the source of the second n-channel transistor and the second input is coupled to the source of the first n-channel transistor.

16. The voltage level translator of claim 1, wherein the preloading means to bring back the boosted voltage on said control node down to the low voltage level comprises a transistor source/drain connected between the low voltage level and said control node and having a gate connected to the control input.

* * * * *

UNITED STATES PATENT AND TRADEMARK OFFICE
CERTIFICATE OF CORRECTION

| | | |
|---|---|---|
| PATENT NO. | : 7,449,933 B2 | Page 1 of 1 |
| APPLICATION NO. | : 11/313281 | |
| DATED | : November 11, 2008 | |
| INVENTOR(S) | : Christophe Goncalves et al. | |

It is certified that error appears in the above-identified patent and that said Letters Patent is hereby corrected as shown below:

At column 1, line number 53, please replace [NMOS] with -- nMOS --.
At column 1, line number 64, please replace [NMOS] with -- nMOS --.
At column 2, line number 15, please replace [NMOS] with -- nMOS --.
At column 5, line number 43, please replace [NMOS] with -- nMOS --.
At column 7, line number 66, please replace [VI 3] with -- VI3 --.

At column 8, claim 1, line 49, replace [n-channel] with -- p-channel --.

Signed and Sealed this
Second Day of August, 2011

David J. Kappos
*Director of the United States Patent and Trademark Office*